United States Patent
Lee et al.

(10) Patent No.: US 11,454,882 B2
(45) Date of Patent: Sep. 27, 2022

(54) PELLICLE FOR REFLECTIVE MASK

(71) Applicant: Samsung Electronics Co., Ltd., Suwon-si (KR)

(72) Inventors: Jinhwan Lee, Osan-si (KR); Jeonggil Kim, Hwaseong-si (KR); Sunghyup Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 140 days.

(21) Appl. No.: 16/922,328

(22) Filed: Jul. 7, 2020

(65) Prior Publication Data
US 2021/0116802 A1    Apr. 22, 2021

(30) Foreign Application Priority Data
Oct. 22, 2019   (KR) .......................... 10-2019-0131392

(51) Int. Cl.
*G03F 1/64*   (2012.01)
*G03F 1/62*   (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC .............................................................. 430/5
See application file for complete search history.

(56) References Cited

U.S. PATENT DOCUMENTS

| 9,874,809 B2 * | 1/2018 | Park .......................... G03F 1/24 |
| 9,958,770 B2 | 5/2018 | Ahn et al. |
| 2013/0004711 A1 | 1/2013 | Doi et al. |
| 2016/0172207 A1 | 6/2016 | Kwon et al. |

FOREIGN PATENT DOCUMENTS

| JP | 3388162 B2 | 3/2003 |
| JP | 5517360 B2 | 6/2014 |
| KR | 10-0849714 B1 | 8/2008 |
| KR | 10-2018-0022273 A | 3/2018 |

* cited by examiner

*Primary Examiner* — Christopher G Young
(74) *Attorney, Agent, or Firm* — Harness, Dickey & Pierce, P.L.C.

(57) ABSTRACT

A pellicle for a reflective mask includes a pellicle body, a pellicle frame below the pellicle body to support the pellicle body, and a pattern structure in at least a part of a surface of the pellicle body, wherein the pattern structure includes a plurality of patterns.

20 Claims, 13 Drawing Sheets

PELLICLE FOR REFLECTIVE MASK

CROSS-REFERENCE TO RELATED APPLICATION

This application claims the benefit of Korean Patent Application No. 10-2019-0131392, filed on Oct. 22, 2019, in the Korean Intellectual Property Office, the disclosure of which is incorporated herein in its entirety by reference.

BACKGROUND

The inventive concepts relate to a pellicle, and more particularly to a pellicle for a reflective mask.

As a degree of integration of semiconductor devices increases, exposure apparatuses which use, as a light source, extreme ultra violet (EUV) light having a shorter wavelength than deep ultra violet (DUV) light have been actively developed to improve resolution. The EUV exposure apparatus may use a reflective mask that uses a reflective property of the EUV light.

The reflective mask may be contaminated by particles when performing an exposure process by using an EUV exposure apparatus. Accordingly, a pellicle for a reflective mask on the reflective mask capable of protecting the reflective mask may be desirable.

SUMMARY

The inventive concepts provide a pellicle for a reflective mask capable of protecting the reflective mask.

According to an aspect of the inventive concepts, there is provided a pellicle for a reflective mask, the pellicle including: a pellicle body; a pellicle frame to support the pellicle body; and a pattern structure in at least a part of a surface of the pellicle body, wherein the pattern structure includes a plurality of patterns.

According to another aspect of the inventive concepts, there is provided a pellicle for a reflective mask, the pellicle including: a pellicle body; a pellicle frame to support the pellicle body; and a first pattern structure and a second pattern structure spaced apart from each other on a surface of the pellicle body. The first pattern structure includes a plurality of first patterns spaced apart from each other, and the second pattern structure includes a plurality of second patterns spaced apart from each other.

According to another aspect of the inventive concepts, there is provided a pellicle for a reflective mask, the pellicle including: a pellicle body; a pellicle frame at a periphery of the pellicle body to support the pellicle body and including an upper portion which supports the pellicle body, wherein a width of the upper portion of the pellicle frame is greater than a width of a lower portion of the pellicle frame; and a pattern structure including a plurality of patterns on the entire surface of the pellicle body. The patterns include concavo-convex patterns which are configured in the same body as the pellicle body and include a plurality of concave patterns and a plurality of convex patterns.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Hereinafter, embodiments of the inventive concepts will be described in detail with reference to the accompanying drawings. The following embodiments of the inventive concepts may be implemented by any one, and the following embodiments may be implemented by combining one or more.

Figure 1:
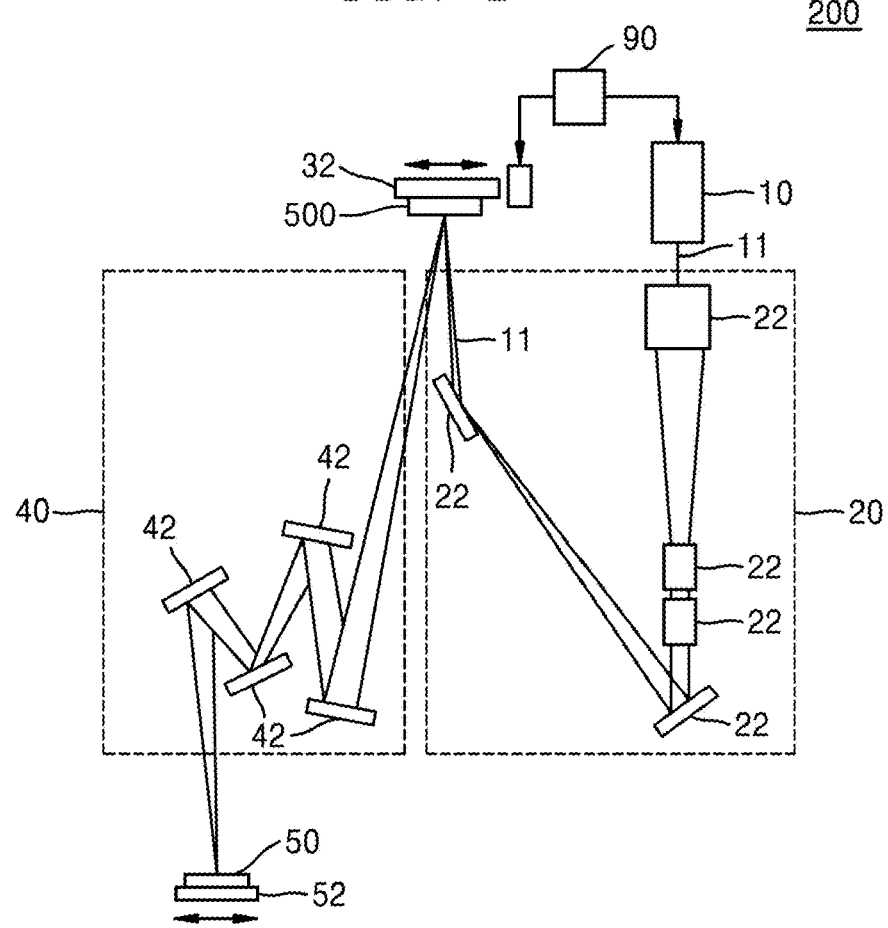
FIG. 1 is a schematic diagram illustrating an EUV exposure apparatus to which the inventive concepts may be applied.

FIG. 1 is a schematic diagram illustrating an extreme ultra violet (EUV) exposure apparatus to which the inventive concepts may be applied.

For example, the EUV exposure apparatus 200 may include an optical source unit 10, a condenser unit 20, a projection unit 40, and/or a control unit 90. The EUV exposure apparatus 200 may be referred to as an extreme ultraviolet exposure apparatus. The optical source unit 10 may generate EUV light, for example, light having a wavelength less than or equal to 100 nm. In some embodiments, the optical source unit 10 may generate the EUV light, for example, light having a wavelength of 13.5 nm or 7 nm. For example, a plasma light source or a synchrotron light source may be used as the optical source unit 10.

The condenser unit 20 may guide light 11 so that the light 11 generated by the optical source unit 10 is reflected from a reflective mask assembly 500 mounted on a mask stage 32. The reflective mask assembly 500 may include a reflective mask (100 of FIG. 2) and a pellicle for a reflective mask (300 of FIG. 3).

The condenser unit 20 may include a condenser optics 22, such as lenses or mirrors. The condenser optics 22 may collect and reflect the light 11 and guide the light to the reflective mask assembly 500. The light 11 may be obliquely incident on the reflective mask assembly 500 through the condenser unit 20. The mask stage 32 may move the reflective mask assembly 500 in a scanning direction of the reflective mask assembly 500. The optical source unit 10 and the mask stage 32 may be controlled by the control unit 90.

The light 11 obliquely incident on the reflective mask assembly 500 may be obliquely incident on the projection unit 40. The projection unit 40 projects a mask pattern (absorption pattern) of the reflective mask (100 of FIG. 2) included in the reflective mask assembly 500 onto an exposure target substrate 50 placed on the substrate stage 52.

The exposure target substrate 50 may be a wafer on which an integrated circuit is formed. A photoresist capable of reacting with light is coated on the exposure target substrate 50. The substrate stage 52 may move the exposure target substrate 50 to change an exposure area (or exposure location) of the exposure target substrate 50.

The projection unit 40 includes a reflective projection optical system 42, such as a lens. The reflective projection optical system 42 may reduce a mask pattern on the reflective mask (100 of FIG. 2) included in the reflective mask assembly 500 in a predetermined, or alternatively, desired magnification, for example, quadruple, sextuple, or octuple by using the light 11 obliquely reflected from the reflective mask assembly 500 and project the reduced mask pattern onto the exposure target substrate 50.

Figure 2:
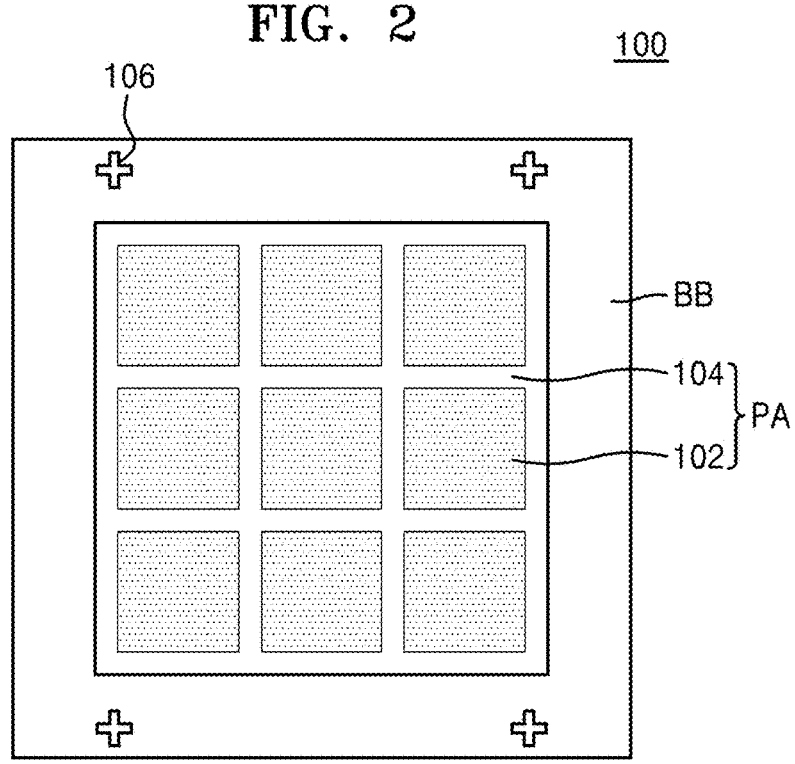
FIG. 2 is a plan view illustrating a schematic configuration of a reflective mask included in a reflective mask assembly of the EUV exposure apparatus of FIG. 1.

FIG. 2 is a plan view illustrating a schematic configuration of the reflective mask included in the reflective mask assembly of the EUV exposure apparatus of FIG. 1.

For example, the reflective mask 100 may include a pattern region PA and a black border region BB. The pattern region PA may include a main pattern region 102 for transferring a main pattern necessary for forming an integrated circuit in a chip region on the exposure target substrate (that is, a wafer, 50 of FIG. 1), and an auxiliary pattern region 104 for transferring an auxiliary pattern to a scribe line region of the exposure target substrate.

The black border region BB may be a region in which no special patterns are formed by surrounding the pattern region PA. A reference mark 106 may be formed in the black border region BB. Four reference marks 106 are illustrated as an example, but the inventive concepts are not limited thereto. The reference mark 106 may be used as a reference point (that is, an original point of a coordinate system) to describe locations of defects that may occur during formation of thin films configuring the reflective mask 100.

Figure 3:
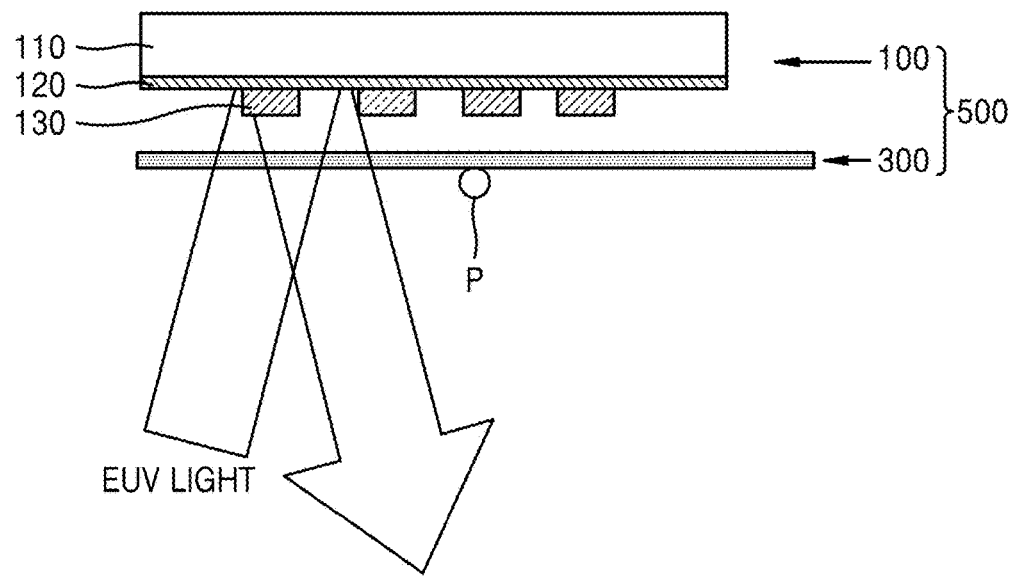
FIG. 3 is a diagram schematically illustrating an exposure process using the EUV exposure apparatus of FIG. 1.

FIG. 3 is a diagram schematically illustrating an exposure process by using the EUV exposure apparatus of FIG. 1.

For example, FIG. 3 is a diagram illustrating the exposure process using EUV light by using the reflective mask assembly 500. The reflective mask assembly 500 may include a reflective mask 100 and a pellicle 300 for a reflective mask that protects the reflective mask 100.

The reflective mask 100 may include a mask substrate (reticle substrate) 100, a reflective layer 120, and/or an absorption pattern 130. The mask substrate 110 may be a glass or quartz substrate. The reflective layer 120 may be formed on the mask substrate 110 to reflect the incident light. That is, as illustrated, the absorption pattern 130 may be formed on the reflective layer 120, and the reflective layer 120 may be exposed between the absorption patterns 130.

For example, the reflective layer 120 may have a multilayer structure in which 30 to 60 Mo/Si layers are repeatedly stacked. The Mo/Si multilayer may be configured by periodically stacking multiple layers formed by stacking a Mo layer on a Si layer. The reflective layer 120 may be a Mo compound/Si compound layer, a Ru/Si layer, a Be/Mo layer, or a Si/Nb layer in addition to the Mo/Si layer. A capping layer 122 of FIG. 18 may also be formed on the reflective layer 120 to protect the reflective layer 120. The capping layer 122 of FIG. 18 may be formed of, for example, ruthenium oxide (RuO) or the like. In some example embodiments, the capping layer 122 of FIG. 17 may be omitted.

The absorption pattern 130 may be formed of an inorganic material or a metal. The absorption pattern 130 may be mainly formed of a tantalum (Ta)-based compound. In some embodiments, the absorption pattern 130 may include a Ta main component and at least one element selected from Hf, Si, Zr, Ge, B, N, and H. For example, the absorption pattern 130 may be formed of TaN, TaHf, TaHfN, TaBSi, TaBSiN, TaB, TaBN, TaSi, TaSiN, TaGe, TaGeN, TaZr, TaZrN, or a combination thereof. Although not illustrated, an anti-reflection coating (ARC) layer may be further formed on the absorption pattern 130. In some example embodiments, the ARC layer may be omitted.

The pellicle 300 for the reflective mask may be disposed below the reflective mask 100 to protect the reflective mask 100. That is, the exposure process may be performed by using the reflective mask assembly 500 including the reflective mask 100 and the pellicle 300 for the reflective mask that protects the reflective mask 100.

Since the pellicle 300 for the reflective mask is provided, particles P introduced from the bottom may be blocked by the pellicle 300 for the reflective mask. Accordingly, an error due to contamination of the reflective mask 100 may be reduced in the exposure process, and a stable exposure process may be performed by using the reflective mask assembly 500.

When the pellicle 300 for the reflective mask included in the reflective mask assembly 500 has high transmittance for EUV light and has thermal and mechanical stability, the EUV exposure apparatus (100 of FIG. 1) may perform a reliable exposure process by using the EUV light. The pellicle 300 for the reflective mask is invented by the inventors to implement this.

Figure 4:
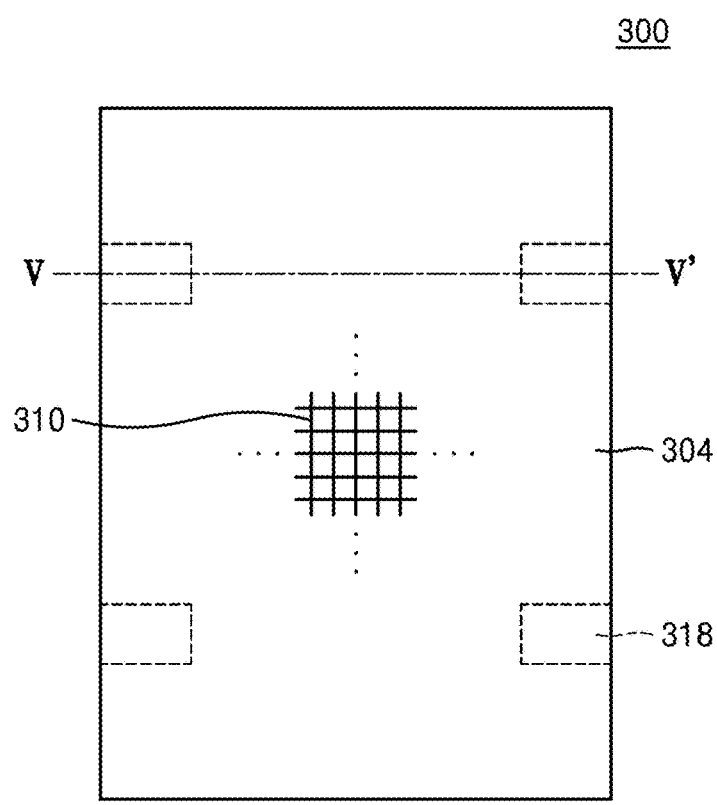
FIG. 4 is a plan view of a pellicle for a reflective mask according to example embodiments of the inventive concepts.
Figure 5:
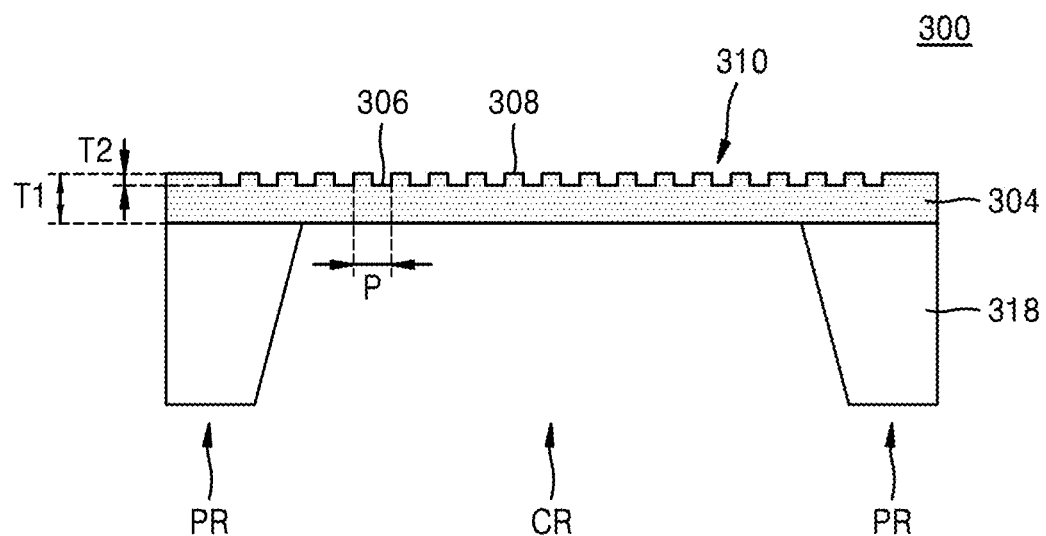
FIG. 5 is a cross-sectional view taken along line V-V' of FIG. 4.

FIG. 4 is a plan view of a pellicle for a reflective mask according to example embodiments of the inventive concepts, and FIG. 5 is a cross-sectional view taken along line V-V' of FIG. 4.

For example, the pellicle 300 for the reflective mask may include a pellicle body 304, a pattern structure 310, and/or a pellicle frame 318. The pellicle 300 for the reflective mask may include a central region CR and a peripheral region PR surrounding the central region CR.

Figure 18:
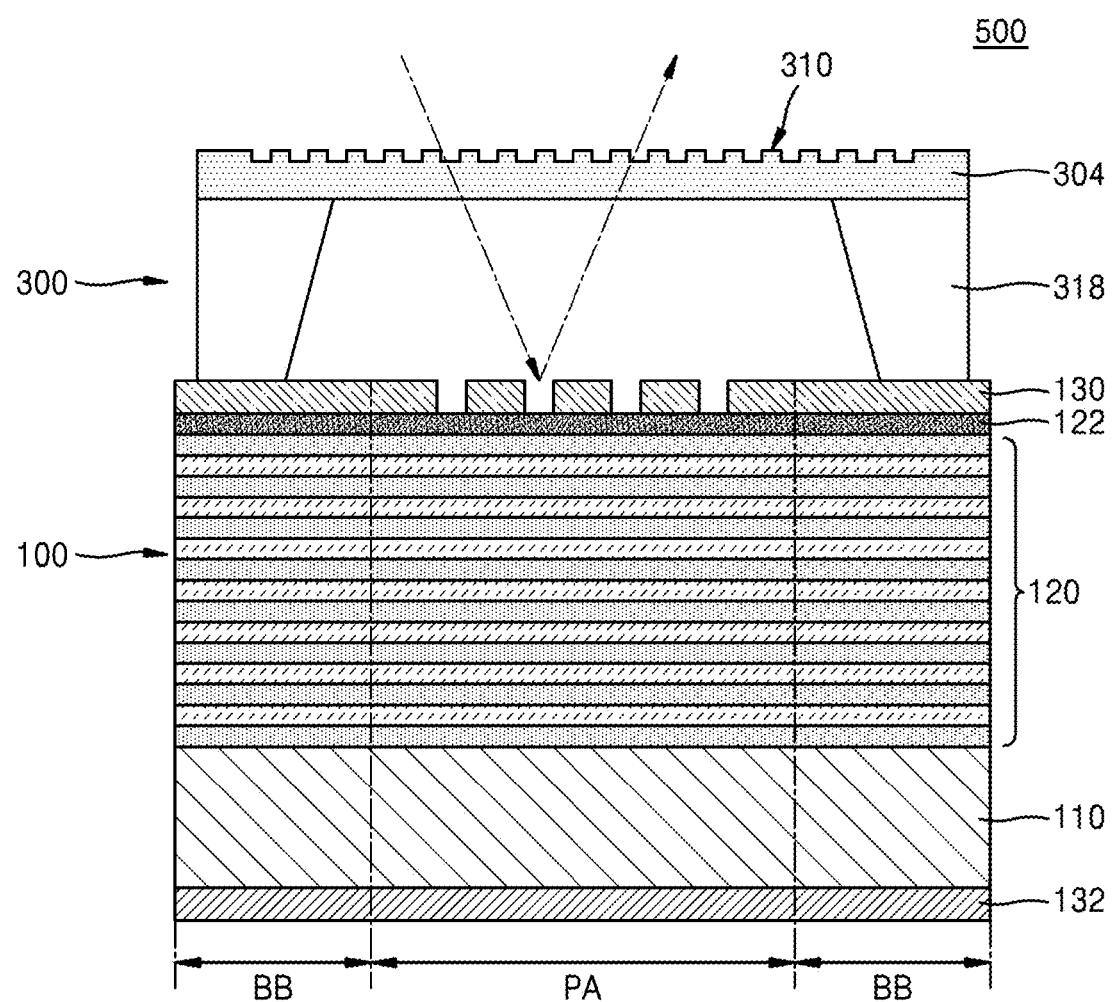
FIG. 18 is a cross-sectional view illustrating a reflective mask assembly according to example embodiments of the inventive concepts.

The central region CR may be a region corresponding to the pattern region PA of the reflective mask 100 in the reflective mask assembly 500 as illustrated in FIG. 18. The peripheral region PR may be a region corresponding to the black border region BB of the reflective mask 100 in the reflective mask assembly 500 as illustrated in FIG. 18.

The pellicle body 304 may be formed of a material having high transmittance for the EUV light. In some embodiments, the pellicle body 304 may be configured by or made of a silicon layer. In some embodiments, the pellicle body 304 may be configured by or made of a polysilicon layer. In some embodiments, a thickness T1 of the pellicle body 304 may be less than 100 nm, for example, 70-80 nm.

The pattern structure 310 may be formed on a surface of the pellicle body 304. The pattern structure 310 may include a plurality of patterns 306 and 308. The patterns 306 and 308 may be concavo-convex patterns having a plurality of concave portion patterns 306 and convex patterns 308. In some embodiments, pitches P of the patterns 306 and 308 may be less than 10 nm, for example, 2 nm to 10 nm.

In some embodiments, a thickness of the convex pattern 308 configuring the pattern structure 310 may be one tenth the thickness of the pellicle body 304. In some embodiments, the thickness T2 of the convex pattern 308 configuring the pattern structure 310 may be less than 10 nm, for example, 7 nm to 8 nm. In some embodiments, patterns 306 and 308 may be formed throughout the surface of pellicle body 304. In some embodiments, the patterns 306 and/or 308 may be configured by or made of the same body as the pellicle body 304.

The pellicle frame 318 supporting the pellicle body 304 may be placed below the pellicle body 304 in the peripheral region PR. The pellicle frame 318 may be configured by or made of a silicon layer. The pellicle frame 318 may be configured by a plurality of frames spaced apart from each other as illustrated in FIG. 4. The pellicle frame 318 may be formed near an edge portion of the pellicle body 304.

The pellicle 300 for the reflective mask described above has the pattern structure 310 formed on the surface of the pellicle body 304, and thus, the thickness of the pellicle 300 for the reflective mask may be reduced and the entire volume may be reduced. Accordingly, the pellicle 300 for the reflective mask may increase transmittance of EUV light penetrating the pellicle body 304.

In addition, the pellicle 300 for the reflective mask has the pattern structure 310 formed on the surface of the pellicle body 304, and thus, a surface area of the pellicle body 304 may increase. Accordingly, the pellicle 300 for the reflective mask more easily discharges the generated heat to the outside, thus, increasing thermal stability of the pellicle body 304 and increasing mechanical stability of the pellicle body 304 because the pellicle body 304 is not deformed due to heat.

Figure 6:
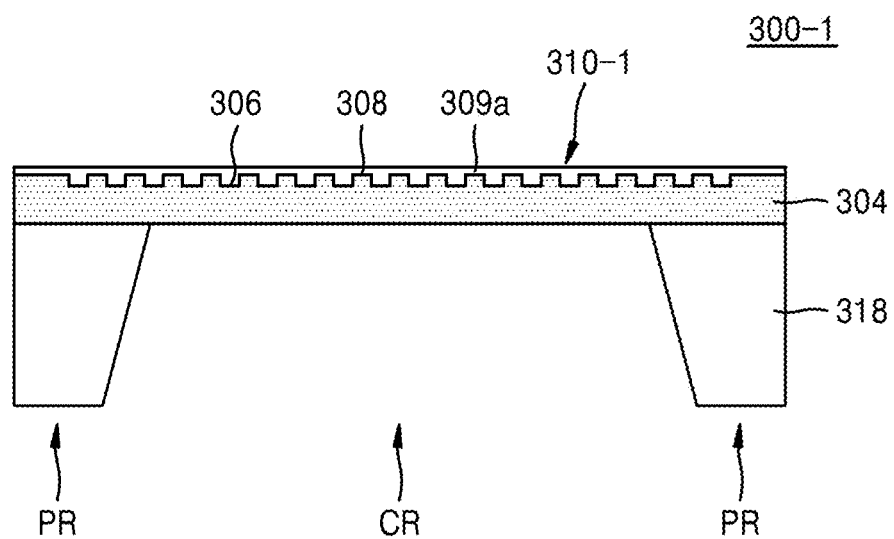
FIG. 6 is a cross-sectional view of a pellicle for a reflective mask according to example embodiments of the inventive concepts.

FIG. 6 is a cross-sectional view of a pellicle for a reflective mask according to example embodiments of the inventive concepts.

For example, a pellicle for a reflective mask 300-1 may be the same as the pellicle 300 for the reflective mask of FIGS. 4 and 5 except that the pellicle 300-1 for the reflective mask has a pattern structure 310-1 including a planarization layer 309a. Accordingly, in describing FIG. 6, the descriptions with reference to FIGS. 4 and 5 will be omitted or described in brief.

The pellicle 300-1 for the reflective mask may include the pellicle body 304, the pattern structure 310-1, and/or the pellicle frame 318. The pattern structure 310-1 may include a plurality of patterns 306 and 308 and the planarization layer 309a placed on the patterns 306 and 308. The patterns 306 and 308 may be concavo-convex patterns having a plurality of concave patterns 306 and a plurality of convex patterns 308.

The planarization layer 309a may be formed on the concave patterns 306 and the convex patterns 308 while filling the concave patterns 306. The planarization layer 309a may be a body different from the pellicle body 304. The planarization layer 309a may be a layer for reducing or preventing reflection of light. The planarization layer 309a may be formed of an inorganic material that is opaque to light or a metal such as chromium (Cr), chromium oxide (CrO), nickel (Ni), copper (Cu), molybdenum (Mo), aluminum (Al), titanium (Ti), uranium (W), or ruthenium (Ru).

As described above, the pellicle 300-1 for the reflective mask may have the pattern structure 310-1 including the planarization layer 309a in addition to the effects described with reference to FIGS. 4 and 5, and thus, light may more easily transmit through the pattern structure 310-1 and the pellicle body 304.

Figure 7:
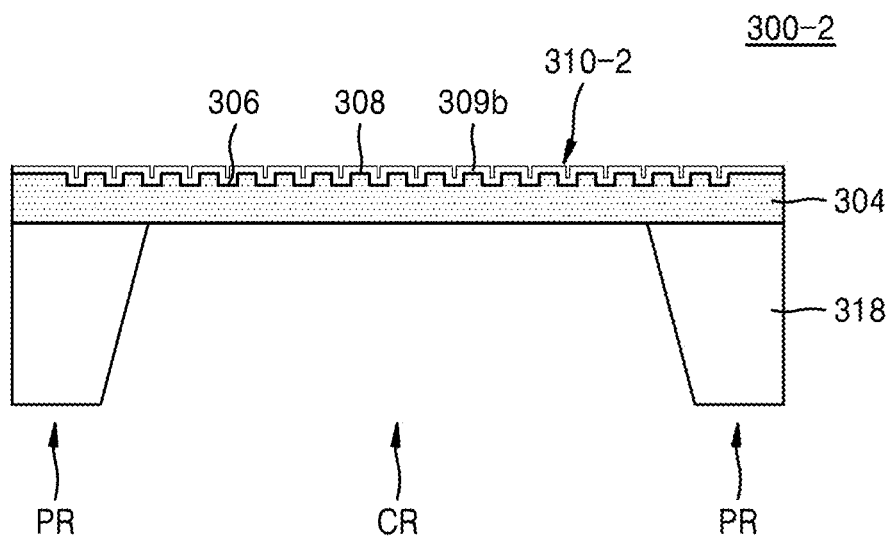
FIG. 7 is a cross-sectional view of a pellicle for a reflective mask according to example embodiments of the inventive concepts.

FIG. 7 is a cross-sectional view of a pellicle for a reflective mask according to example embodiments of the inventive concepts.

For example, a pellicle for a reflective mask 300-2 may be the same as has the pellicles 300 and 300-1 for the reflective mask of FIGS. 4, 5, and 6 except that the pellicle for the reflective mask 300-2 has a pattern structure 310-2 including a curved or conformal layer 309b. Accordingly, in FIG. 7, the descriptions with reference to FIGS. 4, 5, and 6 will be omitted or described in brief.

The pellicle 300-2 for the reflective mask may include the pellicle body 304, the pattern structure 310-2, and/or the pellicle frame 318. The pattern structure 310-2 may include the plurality of patterns 306 and 308 and the curved layer 309b placed on the patterns 306 and 308. The patterns 306 and 308 may be concavo-convex patterns having a plurality of concave patterns 306 and a plurality of convex patterns 308.

The curved layer 309b may be formed along the concave patterns 306 and the convex patterns 308. The curved layer 309b may be a layer for reducing or preventing reflection of light. The curved layer 309b may be formed of the same material as the planarization layer 309a. The curved layer 309b may be a body different from the pellicle body 304.

As described above, the pellicle 300-2 for the reflective mask may have the pattern structure 310-2 including the curved layer 309b in addition to the effects described with reference to FIGS. 4 and 5, and thus, light may more easily transmit through the pattern structure 310-2 and the pellicle body 304.

Figure 8:
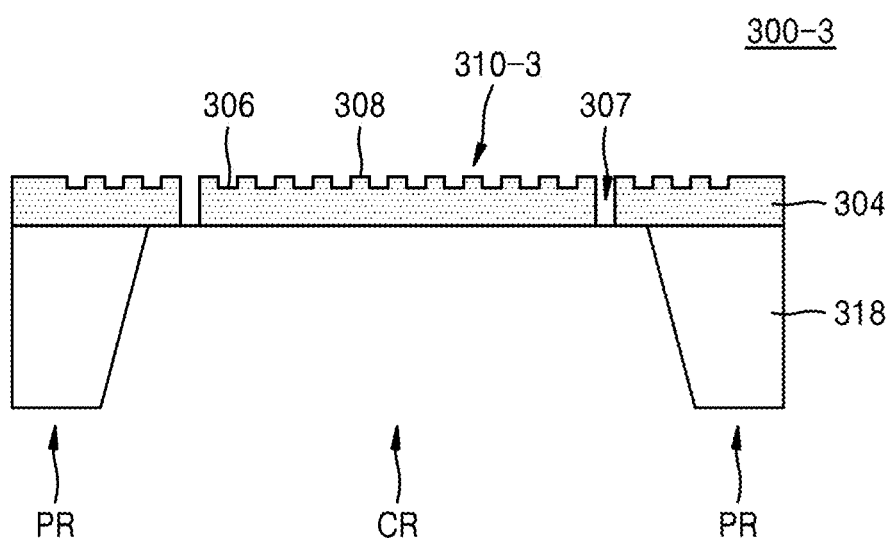
FIG. 8 is a cross-sectional view of a pellicle for a reflective mask according to example embodiments of the inventive concepts.

FIG. 8 is a cross-sectional view of a pellicle for a reflective mask according to example embodiments of the inventive concepts.

For example, the pellicle 300-3 for the reflective mask may be the same as the pellicle 300 for the reflective mask except that the pellicle 300-3 for the reflective mask has a pattern structure 310-3 including at least one ventilation penetrating pattern 307. Accordingly, in FIG. 8, the descriptions with reference to FIGS. 4 and 5 will be omitted or described in brief.

The pellicle 300-3 for the reflective mask may include the pellicle body 304, the pattern structure 310-3, and/or the pellicle frame 318. The pattern structure 310-3 may include the plurality of patterns 306 and 308 and at least one ventilation penetration pattern 307 placed within the patterns 306 and 308 and penetrating the pellicle body 304. The patterns 306 and 308 may be concavo-convex patterns having a plurality of concave patterns 306 and convex patterns 308. The ventilation penetration pattern 307 may be formed in the recess patterns 306 and the convex patterns 308 to reduce or prevent the pellicle body 304 from bending.

Figure 9:
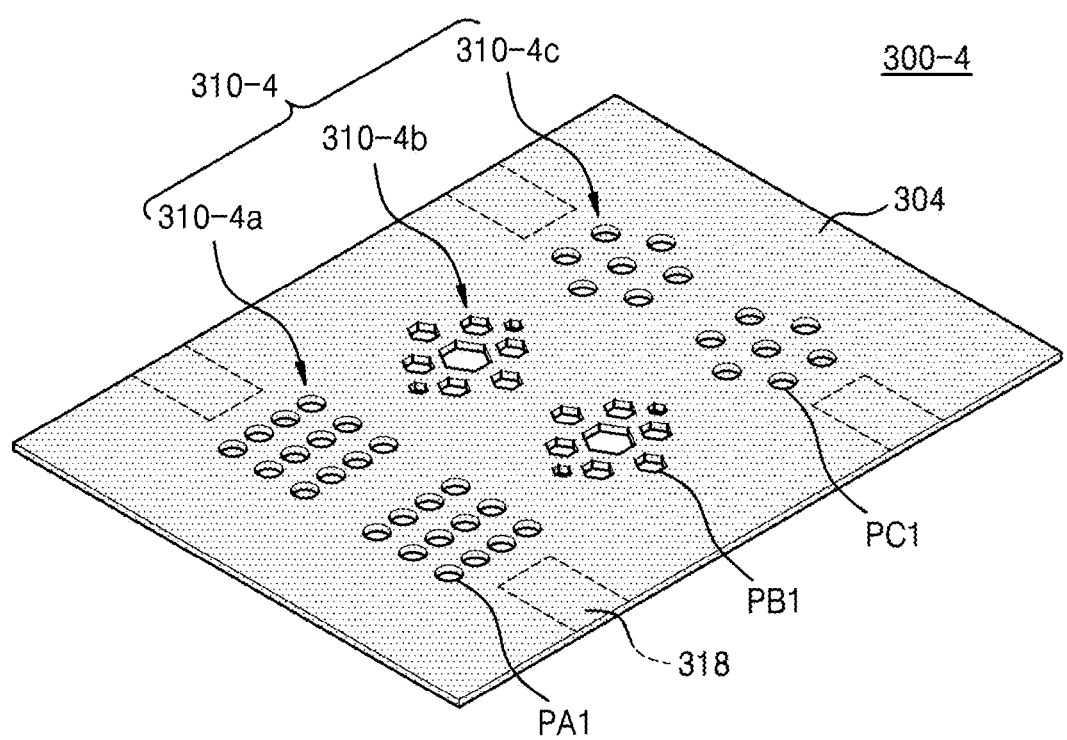
FIG. 9 is a plan view of a pellicle for a reflective mask according to example embodiments of the inventive concepts.

As described above, the pellicle 300-3 for the reflective mask includes the ventilation pattern 307 in the pattern structure 310-3 in addition to the effects described above with reference to FIGS. 4 and 5 to reduce or prevent the pellicle body 304 from bending. FIG. 9 is a plan view of a pellicle for a reflective mask according to example embodiments of the inventive concepts.

For example, a pellicle for a reflective mask 300-4 may be the same as the pellicle 300 for the reflective mask of FIGS. 4 and 5 except that the pellicle 300-4 for the reflective mask has a plurality of pattern structures 310-4 spaced apart from each other and planar shapes of the pattern structures 310-4 are different from each other. Accordingly, in FIG. 9, the descriptions with reference to FIGS. 4 and 5 will be omitted or described in brief.

The pellicle 300-4 for the reflective mask may include the pellicle body 304, the pattern structures 310-4, and/or the pellicle frame 318. The pattern structures 310-4 may include a first pattern structure 310-4a, a second pattern structure 310-4b, and a third pattern structure 310-4c. The first pattern structure 310-4a, the second pattern structure 310-4b, and the third pattern structure 310-4c may be spaced apart from each other. Although three pattern structures 310-4a, 310-4b, and 310-4c are illustrated in FIG. 9, the inventive concepts are not limited thereto.

The first pattern structure 310-4a may include a plurality of first patterns PA1 spaced apart from each other. An arrangement form or the number of the first patterns PA1 may vary. The second pattern structure 310-4b may include a plurality of second patterns PB1 spaced apart from each other. An arrangement form or the number of the second patterns PB1 may vary. The third pattern structure 310-4c may include a plurality of third patterns PC1 spaced apart from each other. An arrangement form or the number of the third patterns PC1 may vary.

The first patterns PA1, the second patterns PB1, and the third patterns PC1 may be penetration patterns penetrating the pellicle body 304. The first patterns PA1 may be circular patterns in a plan view. The second patterns PB1 may be hexagonal patterns in a plan view. The third patterns PC1 may be circular patterns in a plan view. Unlike FIG. 9, the first patterns PA1, the second patterns PB1, and the third patterns PC1 may be at least one of circular patterns, elliptical patterns, and polygonal patterns in a plan view.

The first patterns PA1 may have shapes different from the second patterns PB1 in a plan view. The first patterns PA1 may have the same shape as the third patterns PC1 in a plan view. Unlike FIG. 9, the first patterns PA1, the second patterns PB1, and the third patterns PC1 may have different shapes from each other in a plan view.

In the pellicle 300-4 for the reflective mask described above, the pattern structures 310-4 may have different planar shapes or different arrangement forms from each other, and thus, the effects described in FIGS. 4 and 5 may be more easily obtained.

Figure 10:
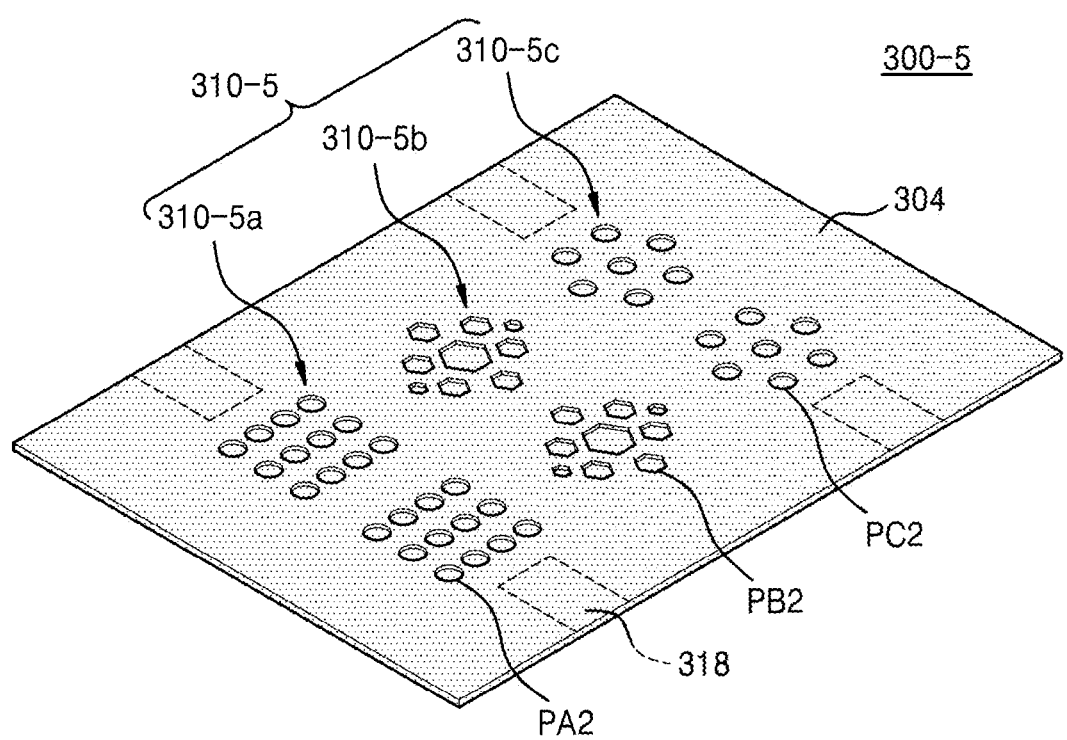
FIG. 10 is a plan view of a pellicle for a reflective mask according to example embodiments of the inventive concepts.

FIG. 10 is a plan view of a pellicle for a reflective mask according to example embodiments of the inventive concepts.

For example, a pellicle for a reflective mask 300-5 may be the same as the pellicle 300-4 for the reflective mask of FIG. 9 except that patterns PA2, PB2, and PC2 configuring the pattern structures 310-5 are non-penetration patterns (they don't penetrate entirely through the reflective mask 300-5). Accordingly, in FIG. 10, the descriptions with reference to FIG. 9 will be omitted or described in brief.

A pellicle for a reflective mask 300-5 may include the pellicle body 304, the pattern structures 310-5, and/or the pellicle frame 318. The pattern structures 310-5 may include a first pattern structure 310-5a, a second pattern structure 310-5b, and a third pattern structure 310-5c spaced apart from each other. Although three pattern structures 310-5a, 310-5b, and 310-5c are illustrated in FIG. 10, the inventive concepts are not limited thereto.

The first pattern structure 310-5a may include the plurality of first patterns PA2 spaced apart from each other. An arrangement form or the number of the first patterns PA2 may vary. The second pattern structure 310-5b may include the plurality of second patterns PB2 spaced apart from each other. An arrangement form or the number of the second patterns PB2 may vary. The third pattern structure 310-5c may include the plurality of third patterns PC2 spaced apart from each other. An arrangement form and the number of the third patterns PC2 may vary.

The first patterns PA2, the second patterns PB2, and the third patterns PC2 may be non-penetration patterns that do not penetrate the pellicle body 304. The first patterns PA2 may be circular patterns in a plan view. The second patterns PB2 may be hexagonal patterns in a plan view. The third patterns PC2 may be circular patterns in a plan view. Unlike FIG. 10, the first patterns PA2, the second patterns PB2, and the third patterns PC2 may be at least one of circular patterns, elliptical patterns, and polygonal patterns in a plan view.

The first patterns PA2 may have a shape different from the second patterns PB2 in a plan view. The first patterns PA2 may have the same shape as the third patterns PC2 in a plan view. Unlike FIG. 10, the first patterns PA2, the second patterns PB2, and the third patterns PC2 may have different shapes from each other in a plan view.

In the pellicle 300-5 for the reflective mask described above, the pattern structures 310-5 may have different planar shapes or different arrangement forms from each other, and thus, the effects described in FIGS. 4 and 5 may be more easily obtained.

In FIG. 9, the first patterns PA1, the second patterns PB1, and the third patterns PC1 configuring the pattern structures 310-4 are formed of penetration patterns, and the first patterns PA2, the second patterns PB2, and the third patterns PC2 configuring the pattern structures 310-5 are formed of non-penetration patterns.

In addition, the pattern structures 310-4 and 310-5 of FIGS. 9 and 10 may be combined. In other words, the penetration patterns and the non-penetration patterns may be selectively formed in the pellicle body 304 by combining the first patterns PA1 and PA2, the second patterns PB1 and PB2, and the third patterns PC1 and PC2.

Figure 11:
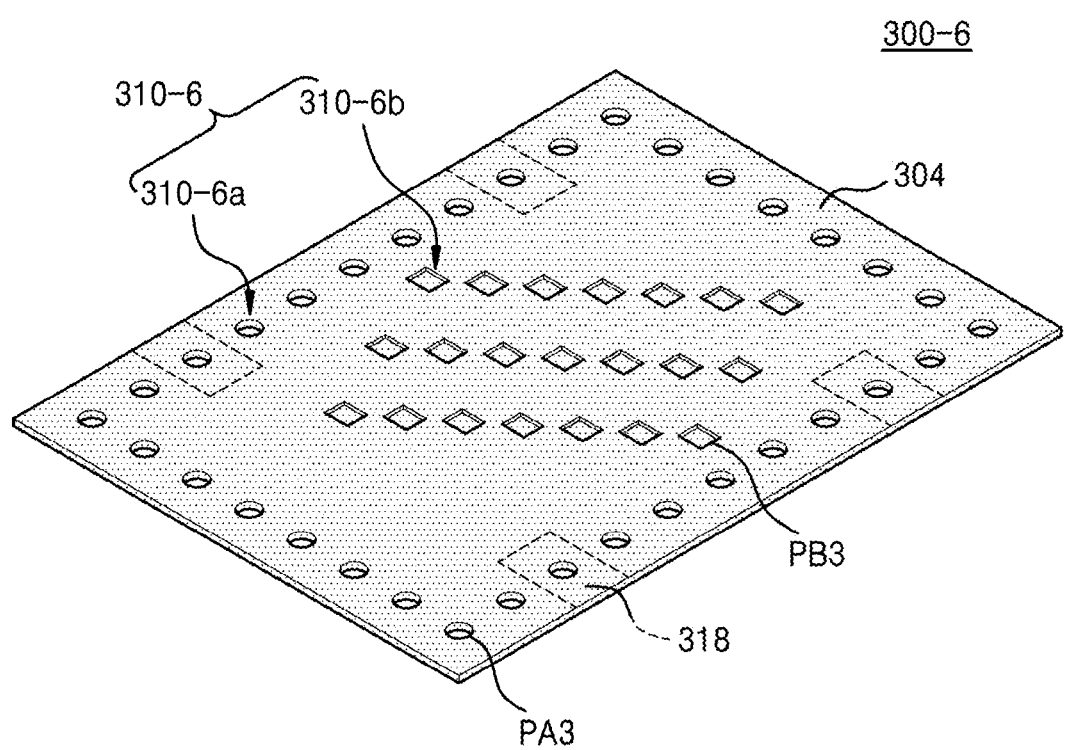
FIG. 11 is a plan view of a pellicle for a reflective mask according to example embodiments of the inventive concepts.

FIG. 11 is a plan view of a pellicle for a reflective mask according to example embodiments of the inventive concepts.

For example, a pellicle for a reflective mask 300-6 may be the same as the pellicle 300-4 for the reflective mask of FIG. 9 except that arrangement forms and structures of the patterns PA3 and PB3 configuring the pattern structures 310-6 are different. Accordingly, in describing FIG. 11, the descriptions with reference to FIG. 9 will be omitted or described in brief.

The pellicle 300-6 for the reflective mask may include the pellicle body 304, the pattern structures 310-6, and/or the pellicle frame 318. The pattern structures 310-6 may include a first pattern structure 310-6a and a second pattern structure 310-6b spaced apart from each other.

The first pattern structure 310-6a may include a plurality of first patterns PA3 spaced apart from each other. The first patterns (PA3) may be formed along edges of the pellicle body 304. An arrangement form or the number of the first patterns PA3 may vary. The second pattern structure 310-6b may include a plurality of the second patterns PB3 spaced apart from each other. The second patterns PB3 may be arranged at a central portion, that is, at a central portion of the pellicle body 304. An arrangement form or the number of the second patterns PB3 may vary.

The first patterns PA3 may be penetration patterns penetrating the pellicle body 304. The second patterns PB3 may be non-penetration patterns that do not penetrate the pellicle body 304. The first patterns PA3 may be circular patterns in a plan view. The second patterns PB3 may be rectangular patterns in a plan view. Unlike FIG. 11, the first patterns PA3 and the second patterns PB3 may be at least one of circular patterns, elliptical patterns, and polygonal patterns in a plan view. The first patterns PA3 may have shapes different from the second patterns PB3 in a plan view.

In the pellicle 300-6 for the reflective mask described above, the pattern structures 310-6 may have different planar shapes or different arrangement forms and different structures from each other, and thus, the effects described in FIGS. 4 and 5 may be more easily obtained.

FIGS. 12A to 12D are cross-sectional views illustrating various shapes of concavo-convex patterns configuring a pattern structure of a pellicle for a reflective mask according to example embodiments of the inventive concepts.

Figure 12A:
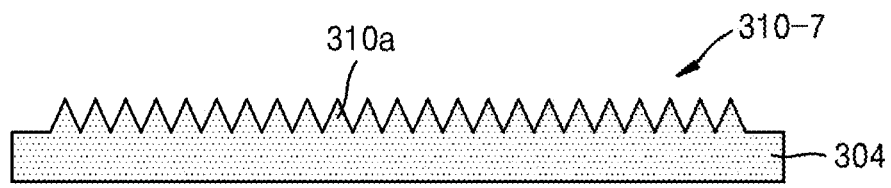
FIGS. 12A to 12D are cross-sectional views illustrating various shapes of concavo-convex patterns configuring a pattern structure of a pellicle for a reflective mask according to example embodiments of the inventive concepts.
Figure 12B:
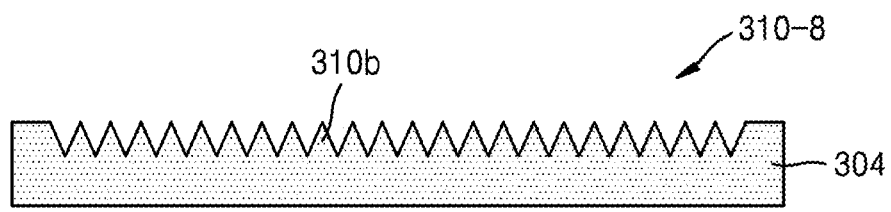

For example, concavo-convex patterns 310a of a pattern structure 310-7 of FIG. 12A may be sawtooth patterns formed in a direction higher than a surface of the pellicle body 304. Concavo-convex patterns 310b of a pattern structure 310-8 of FIG. 12B may be sawtooth patterns formed in a direction lower than the surface of the pellicle body 304.

Figure 12C:
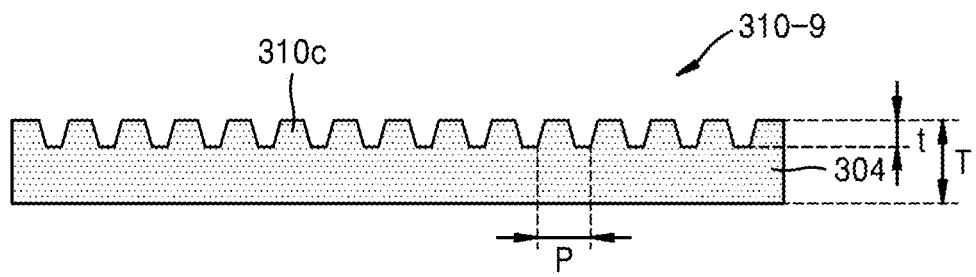
Figure 12D:
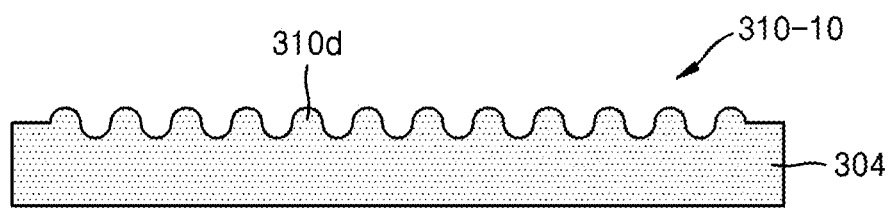

Concavo-convex patterns 310c of a pattern structure 310-9 of FIG. 12C may be ladder patterns formed in the direction lower than the surface of the pellicle body 304. Concavo-convex patterns 310b of a pattern structure 310-10 of FIG. 12D may be peak patterns formed in the directions higher and lower than the surface of the pellicle body 304.

As illustrated in FIGS. 12A to 12D, the concavo-convex patterns 310a to 310d configuring the pattern structures 310-7 to 310-10 of the pellicle for the reflective mask are variously formed, and thus, transmittance of the pellicle for the reflective mask may increase, and thermal and mechanical stability may also increase.

In addition, an entire thickness T of the pattern structure 310-9, a thickness t of the concavo-convex pattern 310c, and a pitch P of the concavo-convex pattern 310c are illustrated representatively in FIG. 12C among FIGS. 12A to 12D. The entire thickness T of the pattern structure 310-9 and the thickness t of the concavo-convex pattern 310c may respectively correspond to the entire thickness T1 of the pattern structure 310 and the thickness T2 of the concavo-convex patterns 306 and 308 of FIG. 5.

The inventive concepts adjust the entire thickness T of the pattern structure 310-9, the thickness t of the concavo-convex pattern 310c, and the pitch P of the concavo-convex patterns 310c, and thus, transmittance of the pellicle for the reflective mask may increase and/or thermal and/or mechanical stability may also increase.

Figure 13:
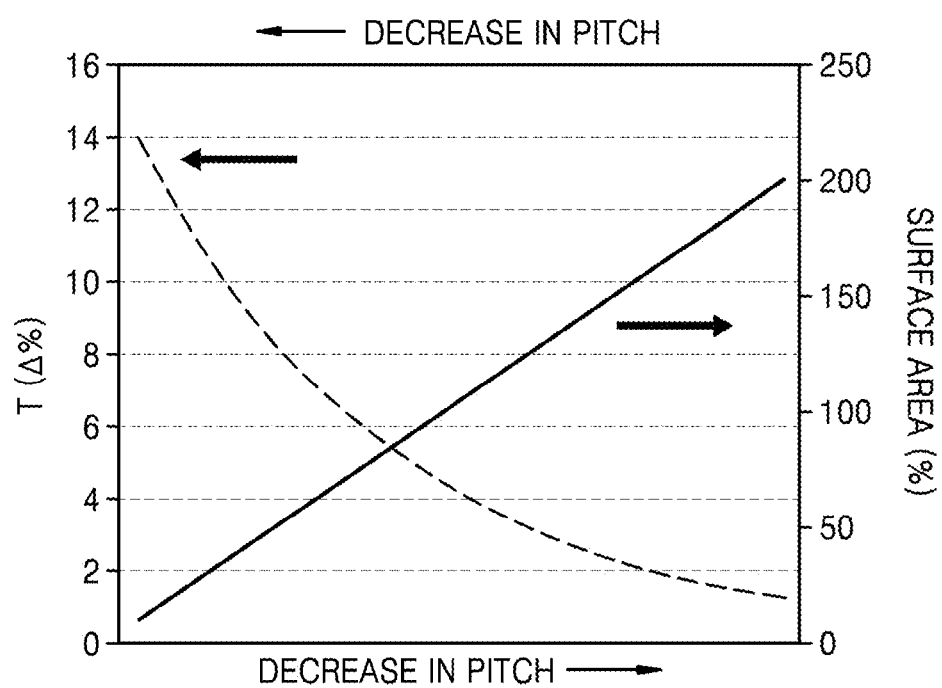
FIG. 13 is a graph illustrating changes in light transmittance and surface area depending on pitches of the concavo-convex patterns configuring the pattern structure of the pellicle for the reflective mask according to example embodiments of the inventive concepts.

FIG. 13 is a graph illustrating changes in light transmittance and surface area depending on the pitches of the concavo-convex patterns configuring the pattern structure of the pellicle for the reflective mask according to example embodiments of the inventive concepts.

For example, FIG. 13 is a graph illustrating changes in light transmittance and surface area according to the pitches P of the concavo-convex patterns 310c of the pattern structure 310-9 of the pellicle for the reflective mask of FIG. 12C. In FIG. 13, a lower coordinate X indicates that the pitch decreases toward the right side. As illustrated in FIG. 13, the surface area (%) may increase as the pitch decreases. The unit (%) represents a ratio between the surface area of the pattern structure with the concavo-convex patterns and the surface area of the pattern structure without the concavo-convex patterns.

In FIG. 13, an upper coordinate X indicates that the pitch decreases toward the left side. As illustrated in FIG. 13, the light transmittance T increases as the pitch decreases. The unit T ($\Delta$%) represents a ratio between the light transmittance of the pattern structure with the concavo-convex patterns and the light transmittance of the pattern structure without the concavo-convex patterns.

As described above, in the pellicle for the reflective mask, as pitches of concavo-convex patterns configuring a pattern structure decreases, a surface area increases and light transmittance increases. For example, in the pellicle for the reflective mask, the entire thickness T of the pattern structure 310-9, the thickness t of the concavo-convex pattern 310c, and the pitch P of the concavo-convex patterns 310c are adjusted, and thus, transmittance may increase, and thermal and mechanical stability may also increase.

FIGS. 14 to 17 are cross-sectional views illustrating a method of manufacturing the pellicle for the reflective mask according to example embodiments of the inventive concepts. FIGS. 14 to 17 are views illustrating a method of manufacturing the pellicle 300 for the reflective mask of FIGS. 4 and 5.

Figure 14:
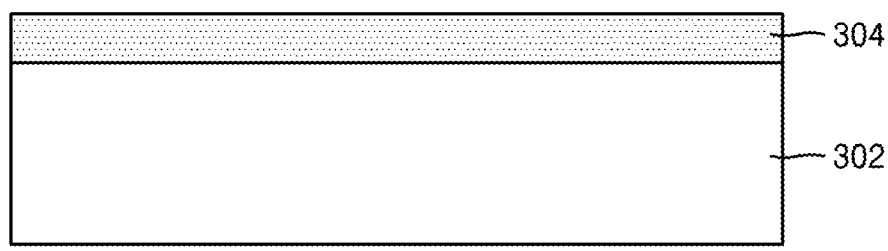
FIGS. 14 to 17 are cross-sectional views illustrating a method of manufacturing a pellicle for a reflective mask according to example embodiments of the inventive concepts.

Referring to FIG. 14, a frame substrate 302 is prepared. The frame substrate 302 may be a silicon substrate. The frame substrate 302 may be a single crystal silicon substrate. The pellicle body 304 is formed on the frame substrate 302. The pellicle body 304 may be configured by a silicon layer. The pellicle body 304 may be configured by a polysilicon layer. A thickness of the pellicle body 304 may be determined in consideration of transmittance of EUV light.

Figure 15:
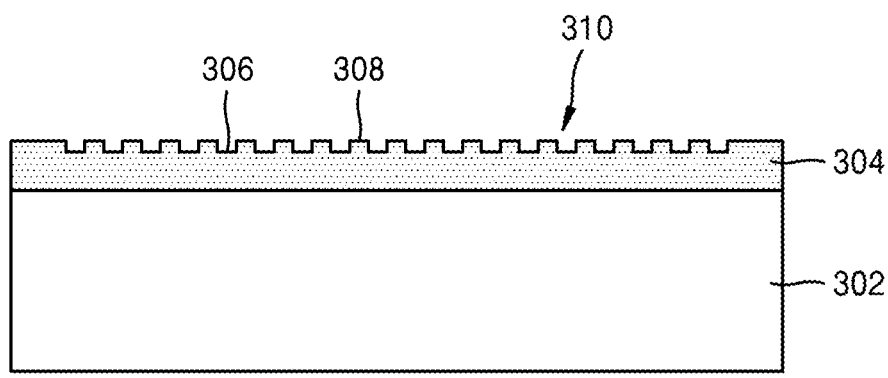

Referring to FIG. 15, the pattern structure 310 is formed on a surface of the pellicle body 304. The pattern structure 310 may include a plurality of patterns 306 and 308. The patterns 306 and 308 may be concavo-convex patterns having a plurality of concave patterns 306 and a plurality of convex patterns 308.

The pattern structure 310 may be formed by using a photolithography process. The photolithography process may be performed by using a method such as nanoimprint lithography (NIL), directed self-assembly (DSA), or emulsion lithography (IL).

Figure 16:
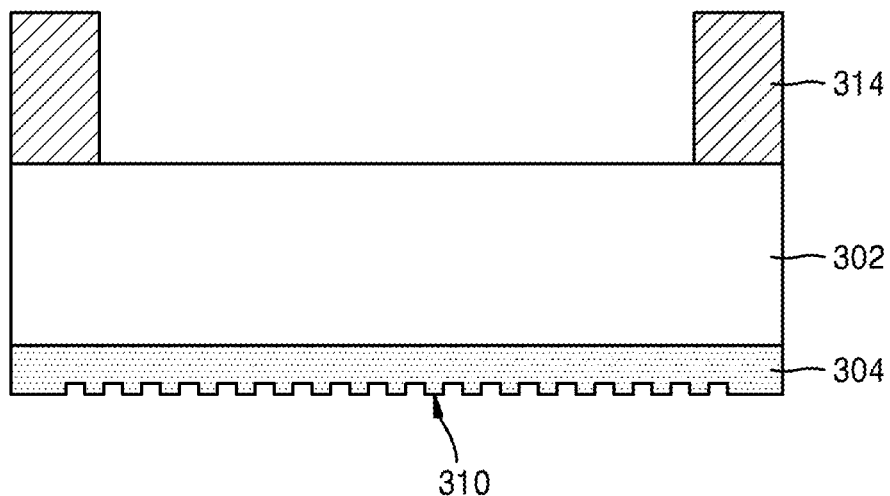

Referring to FIG. 16, the frame substrate 302 is inverted, and then a mask pattern 314 is formed on a part of the rear surface of the frame substrate 302. The mask pattern 314 may be formed as a photoresist pattern. The mask pattern 314 is formed to etch a part of the rear surface of the frame substrate 302.

Figure 17:
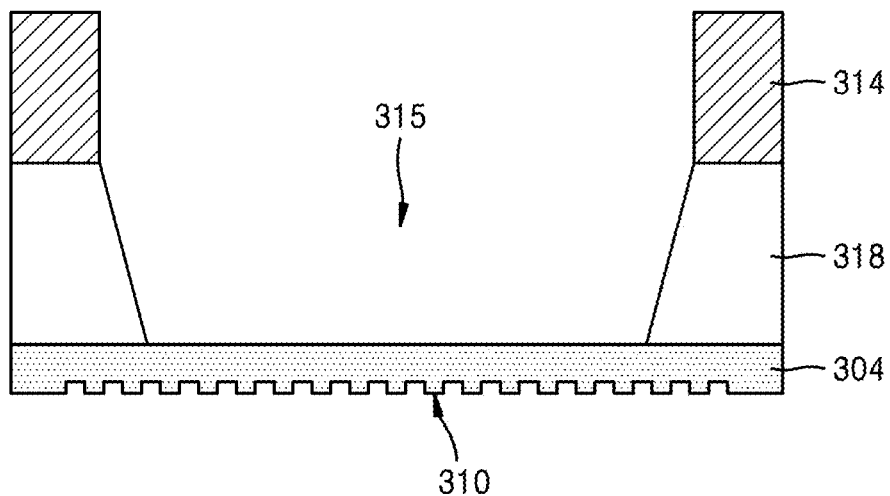

Referring to FIG. 17, the pellicle frame 318 is formed by etching the frame substrate 302 of FIG. 16 by using the mask pattern 314 as an etching mask. The pellicle frame 318 may be formed near edges of the pellicle body 304. Etching of the frame substrate 302 may be performed by using a dry etching method or a wet etching method.

When the frame substrate 302 of FIG. 16 is etched, a hole portion 315 exposing the pellicle body 304 may be formed. When the frame substrate 302 of FIG. 16 is etched, the mask pattern 314 may be etched. When the mask pattern 314 is not etched, the mask pattern 314 may be additionally etched and removed as necessary.

Subsequently, as illustrated in FIG. 5, the pellicle body 304, the pattern structure 310, and/or the pellicle frame 318 are inverted. By doing so, the pellicle 300 for the reflective mask illustrated in FIG. 5 may be obtained.

Hereinafter, a reflective mask assembly including the pellicle for the reflective mask described above and a reflective mask coupled with the pellicle for the reflective mask will be described. For the sake of convenience, the reflective mask assembly will be described with some embodiments of the pellicle for the reflective mask having the various structures described above.

FIG. 18 is a cross-sectional view illustrating a reflective mask assembly according to example embodiments of the inventive concepts.

For example, the reflective mask assembly 500 may include the reflective mask 100 and the pellicle 300 for the reflective mask placed on the reflective mask 100 to protect the reflective mask 100.

As described above with reference to FIG. 2, the reflective mask 100 may include the pattern region PA and the black border region BB surrounding the pattern region PA. As described with reference to FIG. 3, the reflective mask 100 may include the mask substrate (reticle substrate) 110, the reflective layer 120, and/or the absorption pattern 130. The capping layer 122 may be formed on an upper surface of the reflective layer 120.

A base layer 132 may be formed under the mask substrate 110 to be attached to the mask stage 32 of FIG. 1 by vacuum. The base layer 132 may be configured by a chromium nitride layer (CrN). Since configurations and materials of the mask substrate 110, the reflective layer 120, and the absorption pattern 130 are described above with reference to FIG. 3, description thereof will be omitted.

The pellicle 300 for the reflective mask may include the pellicle body 304, the pattern structure 310, and/or the pellicle frame 318 as described above with reference to FIGS. 4 and 5. The pellicle frame 318 may be placed on the black border region BB of the reflective mask 100. The pellicle body 304 may be supported by the pellicle frame 318 and protect the pattern region PA.

The reflective mask assembly 500 may protect the reflective mask 100 by placing the pellicle 300 for the reflective mask on the reflective mask 100. EUV light may be incident on the reflective mask 100 at an upper portion of the pellicle 300 for the reflective mask configuring the reflective mask assembly 500, and the EUV light may be reflected from the reflective mask 100.

Figure 19:
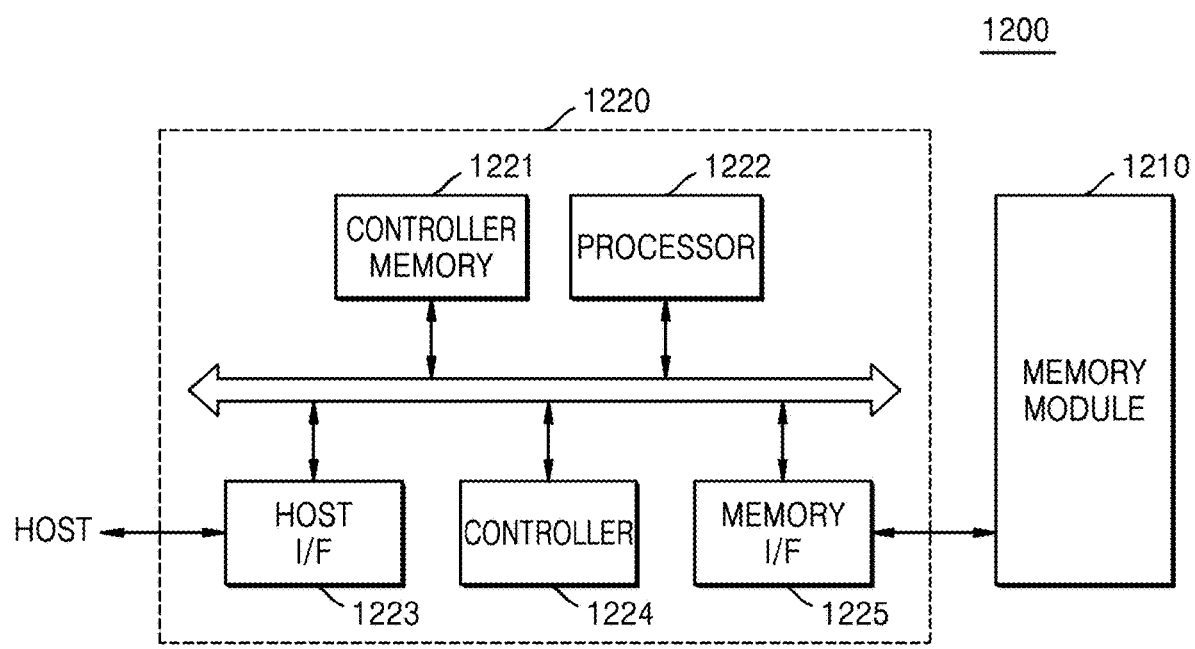
FIG. 19 is a block diagram of a memory card including an integrated circuit manufactured by using the reflective mask assembly according to example embodiments of the inventive concepts.

FIG. 19 is a block diagram of a memory card including an integrated circuit manufactured by using the reflective mask assembly according to example embodiments of the inventive concepts.

For example, a memory card 1200 may include a memory controller 1220 that generates a command/address signal C/A, and a memory module 1210, for example, a flash memory including one or a plurality of flash memory devices. The memory controller 1220 may include a host interface 1223 that transmits the command/address signal to a host or receives the signal from the host, and a memory interface 1225 that transmits the command/address signal to the memory module 1210 again or receives the signal from the memory module 1210. The host interface 1223, the controller 1224, and the memory interface 1225 communicate with a controller memory 1221 and/or a processor 1222, such as a CPU, through a common bus.

The memory module 1210 receives the command/address signal from the memory controller 1220, stores data in at least one of memory devices of the memory module 1210 in response, and searches for data from at least one of the memory devices. Each memory device may include a plurality of addressable memory cells and a decoder that receives a command/address signal and generates a row signal and a column signal to access at least one of the addressable memory cells during programming and a read operation.

At least one of each component of the memory card 1200 including the memory control unit 1220, the electronic devices 1221, 1222, 1223, 1224, and 1225 included in the memory controller 1220, and the memory module 1210 may include an integrated circuit manufactured by using the reflective mask assembly 500 according to example embodiments of the inventive concepts.

Figure 20:
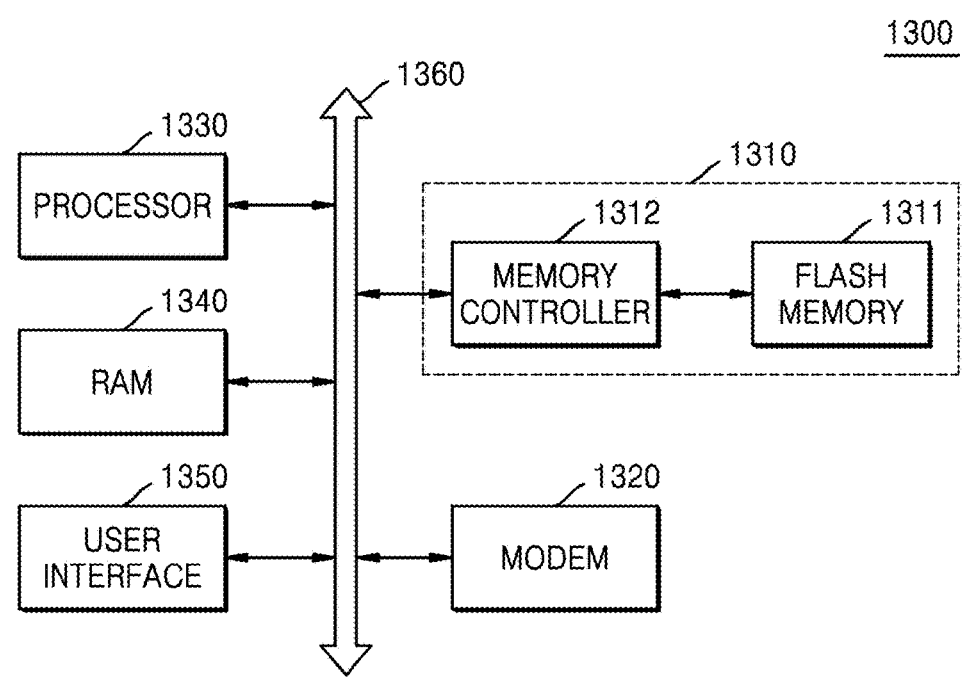
FIG. 20 is a block diagram of a memory system including the integrated circuit manufactured by using the reflective mask assembly according to example embodiments of the inventive concepts.

FIG. 20 is a block diagram of a memory system including the integrated circuit manufactured by using the reflective mask assembly according to example embodiments of the inventive concepts.

For example, a memory system 1300 may include a processor 1330 such as a CPU, a random access memory (RAM) 1340, a user interface 1350, and/or a modem 1320, which communicate with each other through a common bus 1360. Each device transmits a signal to the memory card 1310 and receives the signal from the memory card 1310 through the bus 1360. The memory system 1300 including the memory card 1310, the processor 1330, the random access memory 1340, the user interface 1350, and/or the modem 1320 may include an integrated circuit manufactured by using the reflective mask assembly 500 according to example embodiments of the inventive concepts.

The memory system 1300 may be employed to various electronic applications. For example, the memory system 1300 may be employed to fields of a solid state drive (SSD), a CMOS image sensor (CIS), and a computer application chip set. The memory systems and devices disclosed herein may be packaged in any form of various device package forms including, for example, ball grid arrays (BGA), chip scale packages (CSP), plastic leaded chip carrier (PLCC), plastic dual in-line package (PDIP), multi-chip package (MCP), wafer-level fabricated package (WFP), wafer-level processed stock package (WSP), and so on, and are not limited thereto.

One or more functional blocks of the memory card 1200 or the memory system 1300 may include processing circuitry such as hardware including logic circuits; a hardware/software combination such as a processor executing software; or a combination thereof. For example, the processing circuitry more specifically may include, but is not limited to, a central processing unit (CPU) , an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to embodiments thereof, it will be understood that various changes in form and details may be made therein without departing from the spirit and scope of the following claims.

What is claimed is:

1. A pellicle for a reflective mask, the pellicle comprising:
   a pellicle body;
   a pellicle frame to support the pellicle body; and
   a pattern structure in at least a part of a surface of the pellicle body, the pattern structure being integral to and of a same body as the pellicle body,
   wherein the pattern structure comprises a plurality of patterns.

2. The pellicle of claim 1, wherein the plurality of patterns are over the entire surface of the pellicle body.

3. The pellicle of claim 1, wherein the plurality of patterns comprise penetration patterns spaced apart from each other and penetrate the pellicle body.

4. The pellicle of claim 1, wherein the plurality of patterns comprise non-penetration patterns spaced apart from each other and do not penetrate the pellicle body.

5. The pellicle of claim 1, wherein the plurality of patterns comprise concavo-convex patterns having a plurality of concave patterns and a plurality of convex patterns.

6. The pellicle of claim 5, wherein the pattern structure further comprises at least one ventilation penetration pattern that penetrates the pellicle body inside the plurality of patterns.

7. The pellicle of claim 5, wherein the pattern structure further comprises a planarization layer on the concave patterns and the convex patterns while burying the concave patterns.

8. The pellicle of claim 5, wherein the pattern structure further comprises a curved layer on the concave patterns and the convex patterns and is curved along the concave patterns and the convex patterns.

9. The pellicle of claim 1, wherein the plurality of patterns comprise at least one type of patterns from among circular patterns, elliptical patterns, and polygonal patterns in a plan view.

10. The pellicle of claim 1, wherein the plurality of patterns include at least a first pattern and a second pattern, different from one another.

11. A pellicle for a reflective mask, the pellicle comprising:
    a pellicle body;
    a pellicle frame to support the pellicle body; and
    a first pattern structure and a second pattern structure spaced apart from each other on a surface of the pellicle body the first and second pattern structures being integral to and of a same body as the pellicle body,
    wherein the first pattern structure comprises a plurality of first patterns spaced apart from each other, and the second pattern structure comprises a plurality of second patterns spaced apart from each other.

12. The pellicle of claim 11, wherein the plurality of first patterns have different shapes from the plurality of second patterns in a plan view.

13. The pellicle of claim 11, wherein the plurality of first patterns and the plurality of second patterns comprise at least one type of penetration patterns which penetrate the pellicle body and non-penetration patterns which do not penetrate the pellicle body.

14. The pellicle of claim 13, wherein the at least one type of penetration patterns are arranged along an edge of the pellicle body, and the non-penetration patterns are placed at a central portion of the pellicle body.

15. The pellicle of claim 11, wherein the plurality of first and second patterns comprise at least one type of patterns from among circular patterns, elliptical patterns, and polygonal patterns.

16. A pellicle for a reflective mask, the pellicle comprising:
    a pellicle body;
    a pellicle frame at a periphery of the pellicle body to support the pellicle body and including an upper portion which supports the pellicle body, wherein a width of the upper portion of the pellicle frame is greater than a width of a lower portion of the pellicle frame; and
    a pattern structure including a plurality of patterns on the entire surface of the pellicle body,
    wherein the plurality of patterns comprise concavo-convex patterns which are configured in the same body as the pellicle body and include a plurality of concave patterns and a plurality of convex patterns.

17. The pellicle of claim 16, wherein the pattern structure further comprises at least one ventilation penetration pattern penetrating the pellicle body inside the plurality of patterns.

18. The pellicle of claim 16, wherein the pattern structure further comprises a planarization layer on the concave patterns and the convex patterns.

19. The pellicle of claim 16, wherein the pattern structure further comprises a curved layer on the concave pattern and the convex patterns.

20. The pellicle of claim 16, wherein the concavo-convex patterns are configured as sawtooth patterns, ladder patterns, or peak patterns.

* * * * *